United States Patent
Krassnitzer et al.

(10) Patent No.: US 10,982,321 B2
(45) Date of Patent: Apr. 20, 2021

(54) HOMOGENEOUS HIPIMS COATING METHOD

(71) Applicant: Oerlikon Trading AG, Trubbach, Trubbach (CH)

(72) Inventors: Siegfried Krassnitzer, Feldkirch (AT); Helmut Rudigier, Bad Ragaz (CH)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 1176 days.

(21) Appl. No.: 14/367,354

(22) PCT Filed: Nov. 23, 2012

(86) PCT No.: PCT/EP2012/004847
§ 371 (c)(1),
(2) Date: Jun. 20, 2014

(87) PCT Pub. No.: WO2013/091761
PCT Pub. Date: Jun. 27, 2013

(65) Prior Publication Data
US 2015/0001063 A1    Jan. 1, 2015

(30) Foreign Application Priority Data
Dec. 21, 2011 (DE) .................... 10 2011 121 770.7

(51) Int. Cl.
*C23C 14/35* (2006.01)
*H01J 37/34* (2006.01)
(Continued)

(52) U.S. Cl.
CPC .......... *C23C 14/35* (2013.01); *C23C 14/3464* (2013.01); *C23C 14/3485* (2013.01);
(Continued)

(58) Field of Classification Search
CPC . C23C 14/35; C23C 14/3464; C23C 14/3485; C23C 14/3492; C23C 14/542; H01J 37/3417; H01J 37/3467
(Continued)

(56) References Cited

U.S. PATENT DOCUMENTS 4,515,668 A * 5/1985 Brownell ................ C23C 14/34
204/192.22
5,015,493 A * 5/1991 Gruen ..................... C23C 14/32
204/298.05
(Continued)

FOREIGN PATENT DOCUMENTS

DE    10 2006 017 382 A1    5/2007
DE    10 2006 021 565 A1    6/2007
(Continued)

OTHER PUBLICATIONS

International Search Report for PCT/EP2012/004847 dated May 27, 2013.

*Primary Examiner* — Rodney G McDonald
(74) *Attorney, Agent, or Firm* — Pearne & Gordon LLP

(57) ABSTRACT

The invention relates to a HiPIMS method by means of which homogeneous layers can be deposited over the height of a coating chamber. Two partial cathodes are used for said purpose. According to the invention, the length of the individual power pulse intervals applied to the partial cathodes is chosen individually and thus a required coating thickness profile over the height of the coating chamber is achieved.

8 Claims, 1 Drawing Sheet

(51) Int. Cl.
*C23C 14/34* (2006.01)
*C23C 14/54* (2006.01)

(52) U.S. Cl.
CPC ........ *C23C 14/3492* (2013.01); *C23C 14/542* (2013.01); *H01J 37/3417* (2013.01); *H01J 37/3467* (2013.01)

(58) Field of Classification Search
USPC ...................................... 204/192.12, 298.08
See application file for complete search history.

(56) References Cited

U.S. PATENT DOCUMENTS

| | | | | |
|---|---|---|---|---|
| 6,063,245 | A * | 5/2000 | Frach | C23C 14/0036 |
| | | | | 204/192.13 |
| 2005/0103620 | A1* | 5/2005 | Chistyakov | C23C 14/0063 |
| | | | | 204/192.12 |
| 2007/0181417 | A1 | 8/2007 | Chistyakov | |
| 2008/0202924 | A1* | 8/2008 | Bluck | H01J 37/32009 |
| | | | | 204/298.08 |
| 2014/0339917 | A1* | 11/2014 | Krassnitzer | H01J 37/3467 |
| | | | | 307/106 |

FOREIGN PATENT DOCUMENTS

| | | |
|---|---|---|
| DE | 10 2010 007 516 A1 | 8/2011 |
| DE | 10 2011 117 177 A1 | 5/2013 |
| WO | 2007/054048 A1 | 5/2007 |
| WO | 2012/143087 A1 | 10/2012 |
| WO | 2013/060415 A1 | 5/2013 |

* cited by examiner

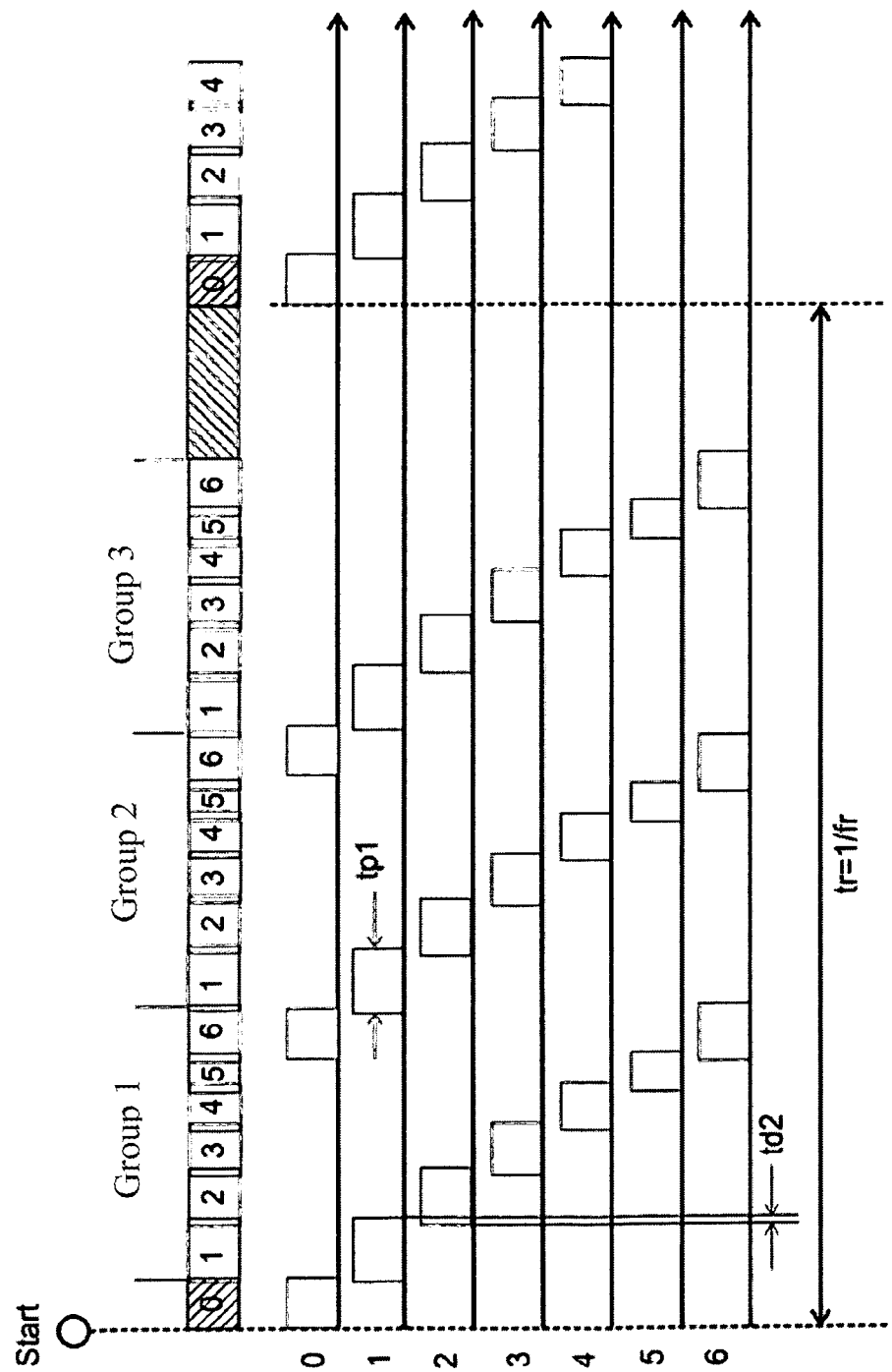

HOMOGENEOUS HIPIMS COATING METHOD

FIELD OF THE INVENTION

The present invention relates to a HiPIMS method by means of which homogeneous layers can be deposited over the height of a coating chamber.

BACKGROUND OF THE INVENTION

The HiPIMS technique is a physical vapor coating method. More precisely, it is a magnetron-assisted sputtering process in which the target supplying the sputter material is subjected to a very high discharge current density, so that a high electron density is generated in the plasma and the majority of the sputtered particles are ionized. For this, current densities between 250 W/cm$^2$ and 2000 W/cm$^2$ are used and particular requirements are therefore made of the generator supplying the power. In particular, it is not possible to have such a power being applied onto the target on a sustained basis, since the latter would overheat and thus become damaged. The power therefore needs to be pulsed. Within the power pulse, very high desired discharge densities are achieved and the target heats up. During the no-impulse period (impulse pause) the target can cool down again. Impulse duration and no-impulse period must be coordinated with one another in such a manner that the average power reaching the target does not exceed a threshold value. For HiPIMS, generators are therefore needed that are capable, when pulsed, of supplying a very high power.

If the HiPIMS method is used for coating workpieces, the workpieces are often distributed over the entire useful coating height. Workpieces are understood to mean both tools as well as other components. In many cases, it is important to coat the workpieces, regardless of whether they are placed at the top, in the middle or at the bottom, with the same layer thickness and with the same layers. This aim is difficult to achieve, in particular when, as in the HiPIMS process, plasmas and their density exert a considerable influence on the coating rate. This is due among others to the fact that the plasmas themselves are influenced by the environment surrounding them, which can result in different coating rates over the height of the coating chamber. In DC sputtering, the attempt is normally made to compensate this by adjusting the magnetic fields over the height. Interventions in the magnet system can however lead locally to modified plasma conditions, which in turn results in different layer properties. The high requirements made in terms of the layer thickness distribution yield a limited useful area (and thus a reduced economic efficiency), since the efficiency of the method mentioned as regards the improvement of the layer thickness homogeneity is limited. A further method for correcting the layer distribution is the use of masks, which is however not very practical should the load or the workpiece geometry change.

It would be desirable to have available a HiPIMS method with which it is possible in a simple manner to adjust the coating rate over the height of a coating chamber and thus achieve a homogenous coating over the entire chamber height without negatively influencing the plasma density and its negative effects on the layer properties.

This constitutes the task of the present invention.

SUMMARY OF THE INVENTION

According to a new method for providing power impulses, which is protected in the context of another patent application, the procedure is such that a PVD sputtering cathode is operated that comprises a first partial cathode and a second partial cathode, wherein for the partial cathodes a maximum average power feed is prescribed and the duration of the power impulse intervals is prescribed, and wherein the method comprises the following steps:

a) providing a generator with a predefined power output, preferably a power output that is constant at least after switching on and after expiration of a power buildup interval,
b) switching on the generator,
c) connecting the first partial cathode to the generator so that the first partial cathode is fed with power from the generator,
d) separating the generator from the first partial cathode after expiration of a predefined first power impulse interval corresponding to the first partial cathode,
e) connecting the second partial cathode to the generator so that the second partial cathode is fed with power from the generator,
f) separating the generator from the second partial cathode after expiration of a predefined second power impulse interval corresponding to the second partial cathode, wherein the first power impulse interval starts time-wise before the second power impulse interval and the first power impulse interval ends time-wise before the second power impulse interval, wherein the steps d) and e) are executed in such a manner that the first power impulse interval and the second power impulse interval overlap in time and all power impulse intervals form together a first group, so that the power output from the generator remains sustained without interruption from the beginning of the first power impulse interval until the end of the second power impulse interval and a second power development interval does not occur.

BRIEF DESCRIPTION OF THE DRAWING

FIG. 1 shows a timing diagram of power pulse intervals.

DETAILED DESCRIPTION

If more than two partial cathodes are provided over the height of the coating chamber, a group can then consist of more than two power impulse intervals. In the method, as many groups are switched sequentially one after the other as the individual partial cathodes can bear in terms of temperature increase. A pause then follows. FIG. 1 shows a corresponding situation with 6 partial cathodes and 3 groups.

According to the invention, the task is solved in that the length of the individual power pulse intervals is selected independently and thus a desired coating thickness profile is achieved over the height of the coating chamber. This means that according to the invention, and not as is usually the case, it is not the magnetic fields that are adjusted over the height of the coating chamber but the duration of the power pulse intervals. This is shown accordingly in FIG. 1. It can be seen that the power impulse intervals assigned to the first partial cathode is considerably longer than the power impulse interval assigned to the partial cathode 5. Due to the longer power pulse interval, the average coating rate output from the partial cathode 1 is longer than the average coating rate output from the partial cathode 5.

In practice, the procedure can for example be such that at first the power pulse intervals of all partial cathodes are chosen to be the same length and thus a first coating is performed for calibration purposes. Subsequently, the coating thicknesses are measured over the height of the coating chamber. If differences in the thicknesses are detected, the power pulse intervals are somewhat increased wherever the layers are too small as compared to the average thickness. Wherever the layers as compared to the average thickness are too large, the power pulse intervals are somewhat shortened. Thanks to this approach, a balance can be achieved, wherein it is clear to the one skilled in the art that several iterative steps can be performed for further improving the homogenization.

The invention has been descried on the basis of the homogenization of the layer thicknesses over the height of the coating chamber. It should however also be understood in such a way that in the event that a layer thickness profile is to be achieved that in particular also deviates from homogenization, the inventive measures can be applied mutatis mutandis.

What is claimed is:

1. Method for the physical vapor deposition by means of sputtering in an evacuated coating chamber, said method comprising the steps of:
    a) arranging a workpiece to be coated over a height of the coating chamber,
    b) providing a generator with a predefined power output,
    c) switching on the generator,
    d) connecting a first partial cathode to the generator so that the first partial cathode is fed with a first power impulse from the generator,
    e) separating the generator from the first partial cathode after expiration of a predefined first power impulse interval corresponding to the first partial cathode,
    f) connecting a second partial cathode to the generator so that the second partial cathode is fed with a second power impulse from the generator, wherein the first partial cathode and the second partial cathode are provided at different vertical locations over the height of the coating chamber,
    g) separating the generator from the second partial cathode after expiration of a predefined second power impulse interval corresponding to the second partial cathode, and
    h) selecting respective lengths of the individual power impulse intervals based on the vertical locations of the first partial cathode and the second partial cathode independently and selecting the length of one of the power impulse intervals relative to the length of another of the power impulse intervals such that the layer resulting from the coating has a predefined layer thickness distribution over the height of the coating chamber.

2. Method according to claim 1, wherein a homogeneous layer thickness distribution is selected as prescribed layer thickness distribution.

3. Method according to claim 1, wherein the first power impulse interval starts time-wise before the second power impulse interval starts and the first power impulse interval ends time-wise before the second power impulse interval ends, wherein the steps e) and f) are executed in such a manner that the first power impulse interval and the second power impulse interval overlap in time and all power impulse intervals form together a first group, so that the power output from the generator remains sustained without interruption from the beginning of the first power impulse interval until the end of the second power impulse interval and a second power development interval does not occur.

4. Method according to claim 1, wherein more than two partial cathodes are used and the steps d) to h) are applied to them in an analogous manner.

5. Method according to claim 1, wherein at least the relative length of the power pulse intervals is determined by means of a calibration coating prior to the coating.

6. Method according to claim 1, wherein the power output is constant at least after switching on and after expiration of a power buildup interval.

7. Method according to claim 1, wherein the physical vapor deposition is conducted by means of high power impulse magnetron sputtering ("HIPIMS") by applying to the first partial cathode and the second partial cathode power densities between 250 W/cm$^2$ and 2000 W/cm$^2$.

8. Method according to claim 1, wherein:
    the second partial cathode is arranged at a vertical position over the height of the coating chamber that is higher than the vertical position of the first partial cathode; and
    the length of the second power impulse interval is longer than the length of the first power impulse interval.

* * * * *